United States Patent [19]
Yoshioka

[11] Patent Number: 6,154,097
[45] Date of Patent: Nov. 28, 2000

[54] PLL OSCILLATING CIRCUIT INCLUDING OSCILLATING CIRCUIT WITH MUTUAL CONDUCTANCE CONTROLLED

[75] Inventor: Kenji Yoshioka, Tokyo, Japan

[73] Assignee: NEC Corporation, Tokyo, Japan

[21] Appl. No.: 09/291,675

[22] Filed: Apr. 14, 1999

[30] Foreign Application Priority Data

Apr. 17, 1998 [JP] Japan .................................. 10-107740

[51] Int. Cl.[7] ...................................................... H03L 7/06
[52] U.S. Cl. .................. 331/18; 331/1 A; 331/8; 331/25; 331/182; 327/156; 327/157; 327/159
[58] Field of Search ...................... 331/25, 172, DIG. 2, 331/1 A, 8, 18, 182; 327/156–159

[56] References Cited

U.S. PATENT DOCUMENTS

| | | |
|---|---|---|
| 4,196,404 | 4/1980 | Ebihara . |
| 4,290,029 | 9/1981 | Streckenbach . |
| 4,864,255 | 9/1989 | Yoshida ..................................... 331/75 |
| 5,010,307 | 4/1991 | Strandberg . |
| 5,534,826 | 7/1996 | Logan ..................................... 331/178 |
| 5,552,751 | 9/1996 | Cooper .............................. 331/116 FE |
| 5,557,243 | 9/1996 | Ho ........................................... 331/158 |
| 5,825,255 | 10/1998 | Dijkmans ................................. 331/173 |
| 5,900,787 | 5/1999 | Yoshimura ........................ 331/116 FE |
| 5,909,152 | 6/1999 | Li et al. ........................... 331/116 FE |
| 5,929,713 | 7/1999 | Kubo et al. ................................ 331/49 |
| 5,936,473 | 8/1999 | Taniguchi et al. ......................... 331/14 |
| 6,025,757 | 2/2000 | Tsukagoshi et al. .................... 331/158 |

FOREIGN PATENT DOCUMENTS

| | | |
|---|---|---|
| 0 378 729 A1 | 7/1989 | European Pat. Off. . |
| 0 847 170 A1 | 6/1998 | European Pat. Off. . |
| 62-36921 | 2/1987 | Japan . |
| 1 215 009 | 12/1970 | United Kingdom . |

OTHER PUBLICATIONS

"Quartz Frequency Device" written by Shotaro Okano, published by Techno; Dec. 15, 1995, pp. 107–119.

"Method of Analyzing and Designing Quartz Circuit in which AGC is applied to Quartz Oscillation Circuit" written by Makoto Kanno, Kibun Cho and Yasuo Tsuzuki, Electrical Society, ECT–93–49; Sep. 2, 1993, pp. 45–52.

*Primary Examiner*—David Mis
*Attorney, Agent, or Firm*—Scully, Scott Murphy & Presser

[57] ABSTRACT

A phase locked loop (PLL) oscillating circuit includes a first oscillating circuit, a lock detector and a reference oscillating circuit. The first oscillating circuit generates an oscillation signal with a first frequency, and controls the first frequency based on a reference signal. The lock detector detects phase lock between the oscillation signal and the reference signal to a lock detection signal. The reference oscillating circuit includes a crystal oscillation element, and generates the reference signal. An oscillation state of the reference oscillating circuit is controlled based on the lock detection signal.

16 Claims, 11 Drawing Sheets

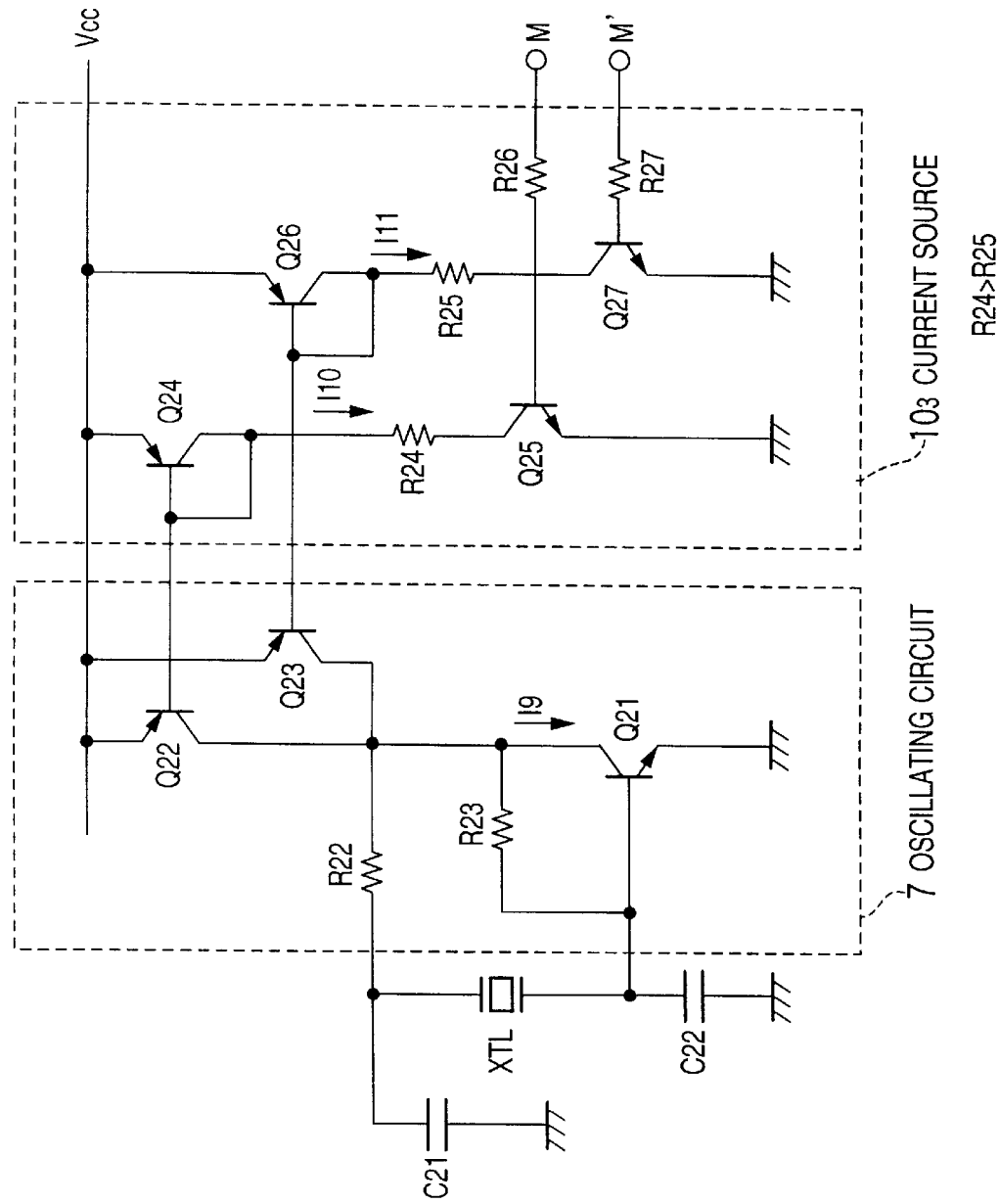

PLL OSCILLATING CIRCUIT INCLUDING OSCILLATING CIRCUIT WITH MUTUAL CONDUCTANCE CONTROLLED

BACKGROUND OF THE INVENTION

1. Field of the Invention

The present invention relates to a PLL circuit and a circuit for a reference oscillation of the PLL circuit. More particularly, the present invention relates to a method of reducing noise resulting from a harmonic component and a circuit for the same.

2. Description of the Related Art

FIG. 1 is a block diagram illustrating a conventional PLL oscillating circuit. In FIG. 1, an oscillating circuit 17 generates an oscillation signal which is divided in frequency by a reference counter 4 into a reference signal. A voltage controlled oscillator (VCO) 1 outputs an oscillation signal which is divided in frequency by a signal counter 3 into a clock signal. The reference signal and the clock signal are supplied to a phase comparator 5. A charge pump 6 supplies an output determined based on the output of the phase comparator 5 to a low pass filter (LPF) 2. The VCO oscillates in accordance with the output of the low pass filter 2.

FIG. 2 is a block diagram illustrating the configuration of a selective call radio receiver in which the conventional PLL oscillating circuit is used as a local oscillator. A reception signal received by an antenna (ANT) 51 is amplified by an amplifier (RFAMP) 52 and is passed through a band pass filter (BPF) 53 to be supplied to a multiplier (1STMIX) 54. The output from an oscillating circuit corresponding to the oscillating circuit shown in FIG. 1 is passed through a frequency multiplying circuit 59 to be supplied to the multiplier (1STMIX) 54. The output of the multiplier 54 is passed through a band pass filter (BPF) 55 and then is supplied to a multiplier (2NDMIX) 56. An oscillation signal is supplied to the multiplier 56 from an oscillating circuit 60 corresponding to the oscillating circuit shown in FIG. 1. An output of the multiplier 56 is passed through a band pass filter (BPF) 57 and then is supplied to a demodulator (DEMOD) 58.

FIG. 3 is a diagram illustrating a Colpitts quartz oscillating circuit, and FIG. 4 is a diagram illustrating an electrically equivalent circuit of the Colpitts quartz oscillating circuit.

In order that a receiver has an excellent radio performance, it is important to reduce various noises resulting from the PLL oscillating circuit. A dead zone performance of a phase comparator, a reference leak due to a comparison frequency, a frequency performance of a low pass filter (LPF) and the like have influence on a carrier to noise ratio (C/N) of a voltage controlled oscillator (VCO), and also determines a sensitivity suppressing performance of the receiver.

Moreover, harmonic component noise in a quartz oscillating circuit or a VCO circuit causes spurious disturbances. In order to suppress the spurious disturbances, it is necessary to restrain an oscillation level of an oscillating circuit not to be excessively large and to insert filters between stages at respective circuit sections. Thus, the harmonic component noise in the oscillating circuit can be reduced.

As mentioned above, the problem is the occurrence of the harmonic component in this quartz oscillating circuit. The level of the harmonic component can be reduced if an oscillation output can be made closer to an oscillation of a sine wave. For this purpose, it is necessary to suppress an amplitude of the oscillation so that an amplitude of the output of the oscillating circuit is not limited by a voltage of a power supply or a collector saturation of a transistor.

However, if the amplitude of the quartz oscillating circuit is made lower, a start performance becomes worse, so that a lockup time of the PLL oscillating circuit becomes longer. In an apparatus having a system for performing a battery saving function, a time period between a time when the PLL oscillating circuit is turned ON and a time when the receiver is turned ON (a start of a receiving operation) is referred to as a start margin. Thus, the receiver is designed in such a manner that the lockup of the PLL oscillating circuit is completed within the start margin. A life of a battery is shortened if the start margin is set to be larger as the lockup time is made longer.

In conjunction with the above description, a PLL system offset frequency synthesizing circuit is described in Japanese Laid Open Patent Application (JP-A-Showa 62-36921). In this reference, a mixer frequency-converts an output signal from a voltage controlled oscillator based on an externally supplied RF sine signal. A first phase comparator compares the signal mixed down by the mixer with an offset frequency signal in frequency. A second phase comparator compares the output signal from the voltage controlled oscillator and the RF sine signal. A maximum value circuit selects a larger one of the output from the first phase comparator and the output from the second phase comparator and supplies the selected output as a control signal to the voltage controlled oscillator.

SUMMARY OF THE INVENTION

An object of the present invention is to provide an oscillating circuit and a phase locked loop (PLL) oscillating circuit using the oscillating circuit in which a noise can be reduced.

Another object of the present invention is to provide an oscillating circuit and a phase locked loop (PLL) oscillating circuit using the oscillating circuit in which a power consumption can be reduced.

Still another object of the present invention is to provide a method of controlling an oscillation to reduce a noise and a power consumption.

In order to achieve an aspect of the present invention, a phase locked loop (PLL) oscillating circuit includes a first oscillating circuit, a lock detector and a reference oscillating circuit. The first oscillating circuit generates an oscillation signal with a first frequency, and controls the first frequency based on a reference signal. The lock detector detects phase lock between the oscillation signal and the reference signal to a lock detection signal. The reference oscillating circuit includes a quartz oscillation element, and generates the reference signal. An oscillation state of the reference oscillating circuit is controlled based on the lock detection signal.

The reference oscillating circuit may include an oscillating circuit oscillating to generate a first signal, a frequency divider for dividing the first signal in frequency to generate the reference signal, and a control circuit. The control circuit controls the oscillating circuit in response to a start signal to oscillate with a first transconductance and controls the oscillating circuit in response to the lock detection signal to oscillate with a second transconductance which is smaller than the first transconductance.

When the oscillating circuit oscillates with the first transconductance, an absolute value of a negative resistance of the oscillating circuit is three time to ten times more than an equivalent resistance of the quartz oscillation element, and when the oscillating circuit oscillates with the second transconductance, the absolute value of the negative resistance of the oscillating circuit is equal to the equivalent resistance of the quartz oscillation element.

Also, the oscillating circuit may include the quartz oscillation element, an oscillation transistor for performing an oscillation operation using the quartz oscillation element, and a control transistor provided in parallel to the oscillation transistor, and being activated in response to a control signal. In this case, the control circuit outputs the control signal to the control transistor in response to the lock detection signal to reduce a collector current of the oscillation transistor such that the oscillation transistor continues the oscillation operation with the reduced collector current.

The oscillating circuit may include the quartz oscillation element, an oscillation transistor for performing an oscillation operation using the quartz oscillation element, a first control transistor activated in response to a first control signal, and a second control transistor activated in response to a second control signal. In this case, the control circuit outputs the first control signal to the first control transistor in response to the start signal such that the first control transistor flows a first current as a collector current of the oscillation transistor, and outputs the second control signal to the second control transistor in response to the lock detection signal such that the second control transistor flows a second current as the collector current of the oscillation transistor, the second current is smaller than the first current, and the oscillation transistor continuing the oscillation operation with the second current.

Also, the oscillating circuit may include the quartz oscillation element, and an oscillation transistor for performing an oscillation operation using the quartz oscillation element. In this case, the control circuit controls the oscillation transistor to perform a class A operation and then a class C operation in response to the start signal and controls the oscillation transistor to perform the class A operation in response to the lock detection signal.

In order to achieve another aspect of the present invention, a method of controlling oscillation in an oscillation circuit using a quartz oscillation element, includes:

starting oscillation in response to a first signal;

increasing an amplitude of the oscillation; and decreasing the amplitude of the oscillation in response to a second signal within a predetermined time from the first signal.

A transconductance of the oscillation circuit in the starting step and the increasing step is larger than that of the oscillation circuit in the decreasing step.

Also, the oscillation circuit may include an oscillation transistor for performing the oscillation using the quartz oscillation element. In this case, the starting step and the increasing step include supplying a first collector current to the oscillation transistor, and the decreasing step includes supplying a second collector current to the oscillation transistor, the second collector current being smaller than the first collector current. In another case, the oscillation transistor operates in a class A in the starting step, in a class C in the increasing step, and in the class A in the decreasing step.

In order to achieve still another aspect of the present invention, an oscillating circuit includes an oscillating section having a quartz oscillation element and oscillating to generate a first oscillation signal, and a control section. The control section controls the oscillating section in response to a first timing signal to oscillate with a first transconductance and controls the oscillating section in response to a second timing signal to oscillate with a second transconductance which is smaller than the first transconductance, the second timing signal being generated within a predetermined time from the first timing signal.

When the oscillating section oscillates with the first transconductance, an absolute value of a negative resistance of the oscillating section is three time to ten times more than an equivalent resistance of the quartz oscillation element, and when the oscillating section oscillates with the second transconductance, the absolute value of the negative resistance of the oscillating section is equal to the equivalent resistance of the quartz oscillation element.

The oscillating section may include an oscillation transistor for performing an oscillation operation using the quartz oscillation element and a control transistor provided in parallel to the oscillation transistor, and being activated in response to a control signal. In this case, the control circuit outputs the control signal to the control transistor in response to the second timing signal to reduce a collector current of the oscillation transistor such that the oscillation transistor continues the oscillation operation with the reduced collector current.

The oscillating circuit may include an oscillation transistor for performing an oscillation operation using the quartz oscillation element, a first control transistor activated in response to a first control signal, and a second control transistor activated in response to a second control signal. In this case, the control circuit outputs the first control signal to the first control transistor in response to the first timing signal such that the first control transistor flows a first current as a collector current of the oscillation transistor, and outputs the second control signal to the second control transistor in response to the second timing signal such that the second control transistor flows a second current as the collector current of the oscillation transistor, the second current is smaller than the first current, and the oscillation transistor continuing the oscillation operation with the second current.

Also, the oscillating circuit may include an oscillation transistor for performing an oscillation operation using the quartz oscillation element. In this case, the control circuit controls the oscillation transistor to perform a class A operation and then a class C operation in response to the start signal and controls the oscillation transistor to perform the class A operation in response to the lock detection signal.

The oscillating circuit may be used in a phase locked loop (PLL) oscillating circuit, and the PLL oscillating circuit may be used in a radio apparatus.

BRIEF DESCRIPTION OF THE DRAWINGS

FIG. 13 is a block diagram illustrating the oscillating circuit and the current source in the PLL oscillating circuit according to a third embodiment of the present invention.

DESCRIPTION OF THE PREFERRED EMBODIMENTS

A phase locked loop (PLL) oscillating circuit of the present invention will be described below in detail with reference to the attached drawings.

In the present invention, the PLL oscillating circuit has a configuration that transconductance gm of an oscillating circuit in a start state and that of the oscillating circuit in a steady state are switched through current limitation of an oscillating circuit. The transconductance gm and the start performance of the oscillating circuit are well known and described in, for example, "Quartz Frequency Device" written by Shotaro Okano and published by (Techno).

It is well known that a negative resistance –Rn is given from a gain obtained by a transistor of the oscillating circuit. In a case of a signal with a small amplitude at a start time of the oscillation, it is necessary to design the negative resistance –Rn to have a sufficiently larger value, i.e., a value three to ten times larger than an equivalent resistance of a quartz oscillation element. When the oscillating circuit satisfies an oscillation condition that the negative resistance –Rn cancels a loss Rp resulting from the resistance of the circuit, the oscillating circuit starts to oscillate and further proceeds to the steady condition. The amplitude condition when the oscillation is started is Re<|–Rn|.

Figure 3:
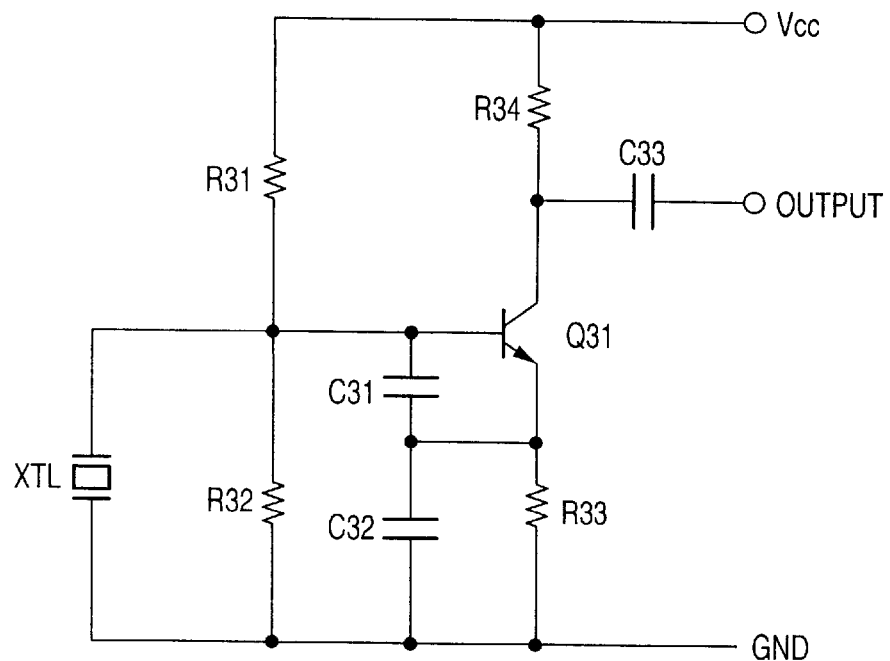
FIG. 3 is a diagram illustrating a Colpitts quartz oscillating circuit.
Figure 4:
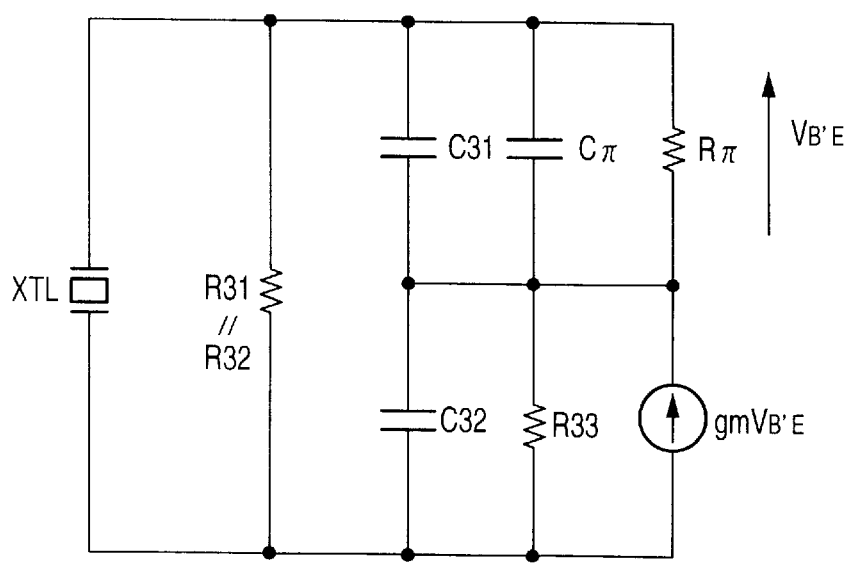
FIG. 4 is a diagram illustrating an electrically equivalent circuit of the Colpitts quartz oscillating circuit.

In a Colpitts oscillator shown in FIG. 3, the negative resistance –Rn in the case of the signal with a small amplitude at the start time of the oscillation is represented as follows:

$$-Rn = -gm/\{\omega^2 C2(C1+C\pi)\}$$

If the transconductance gm is larger, the negative resistance becomes larger, which causes the start performance to be faster.

The method of switching the transconductance gm between the start state and the steady state can be considered to be an AGC (Automatic Gain Control) in a sense. A design method of loading the quartz oscillating circuit to the AGC circuit is proposed and analyzed in "Method of Analyzing and Designing Quartz Circuit in Which AGC Is Applied to Quartz Oscillation Circuit" written by Makoto Kanno, Kibun Cho and Yasuo Tsuzuki (Electrical Society, ECT-93-49).

In the method proposed by this thesis, an oscillation amplitude level is detected by use of a rectifying circuit, and then the direct current bias of a transistor in an oscillating circuit is controlled in analog. As a result, the transistor in the oscillating circuit is made to function as a class A operation in the steady state. For this purpose, the direct current bias of the transistor in an oscillation stage in the steady state is set in such a manner that the negative resistance –Rn in the circuit generates a negative resistance necessary for the steady oscillation in the case of the signal with the small amplitude.

In the present invention, the configuration can be simplified rather than an analog AGC circuit, since an output of an existing circuit within a PLL oscillating circuit is used as a control signal required to digitally switch the transconductance gm. The transconductance gm switching is performed by switching a current flowing through an oscillating circuit. The switching operation is digitally performed by use of a lock detection signal of the PLL oscillating circuit.

Figure 5:
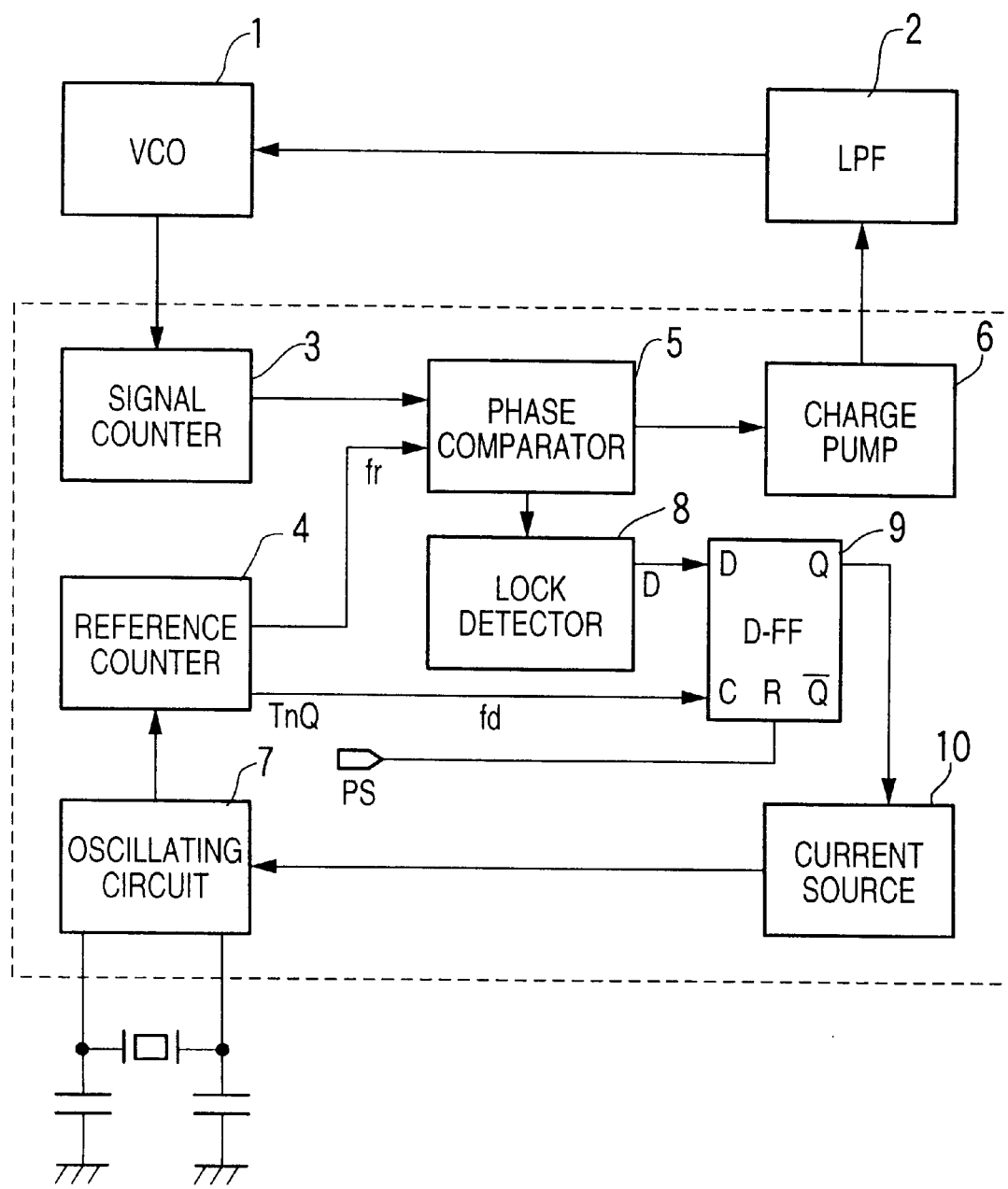
FIG. 5 is a block diagram illustrating a PLL oscillating circuit according to a first embodiment of the present invention.

FIG. 5 shows the circuit structure of the PLL oscillating circuit according to the first embodiment of the present invention. The PLL oscillating circuit is composed of a voltage controlled oscillator (VCO) 1, a low pass filter (LPF) 2, a signal counter 3, a reference counter 4, a phase comparator 5, a charge pump 6, an oscillating circuit 7, a lock detector 8, a D-type flip-flop (D-FF) 9, and a current source 10. Elements within a dashed line are integrated in a chip.

The voltage controlled oscillator VCO1 generates an oscillation signal in accordance with an input voltage. The oscillation frequency of the oscillation signal is changed in accordance with the input voltage from an output voltage of the low pass filter 2. The signal counter 3 divides the oscillation signal from the voltage controlled oscillator VCO 1 into 1/M in frequency.

Capacitors and a quartz oscillation element XTL are connected to the oscillating circuit 7 as external elements. The reference oscillating circuit 7 generates a reference oscillation signal with the amplitude determined based on an amplitude control signal, using the capacitors and the quartz oscillation element. The reference counter 4 divides the reference oscillation signal from the reference oscillating circuit 7 into 1/N in frequency.

The phase comparator 5 compares the frequency-divided signal from the signal counter 3 and the frequency-divided reference signal from the reference counter to detect a phase difference between their signals. The charge pump 6 converts the phase difference into a direct current voltage which is supplied to the voltage controlled oscillator VCO1 through the low pass filter 2.

The lock detector 8 detects a lock state or unlock state of the PLL oscillating circuit, i.e., whether the frequency-divided signal from the signal counter 3 is matched to the frequency-divided reference signal from the reference counter in phase, based on the output of the phase comparator 5. The D flip-flop D-FF 9 receives the output from the lock detector 8 at the data terminal D, a frequency-divided reference signal TnQ from the reference counter 4 at the clock terminal C, and a start control signal PS at the reset terminal R. The D flip-flop 9 outputs the state from the output terminal Q. When the frequency-divided reference signals supplied from the reference counter 4 to the phase comparator 5 and the D flip-flop 9 respectively have the frequencies fr and fd, a frequency condition is fd>>fr. The current source 101 generates the amplitude control signal based on the output of the D flip-flop D-FF 9. A circuit current determined by the current source 10 flows into the oscillating circuit 7.

Figure 6:
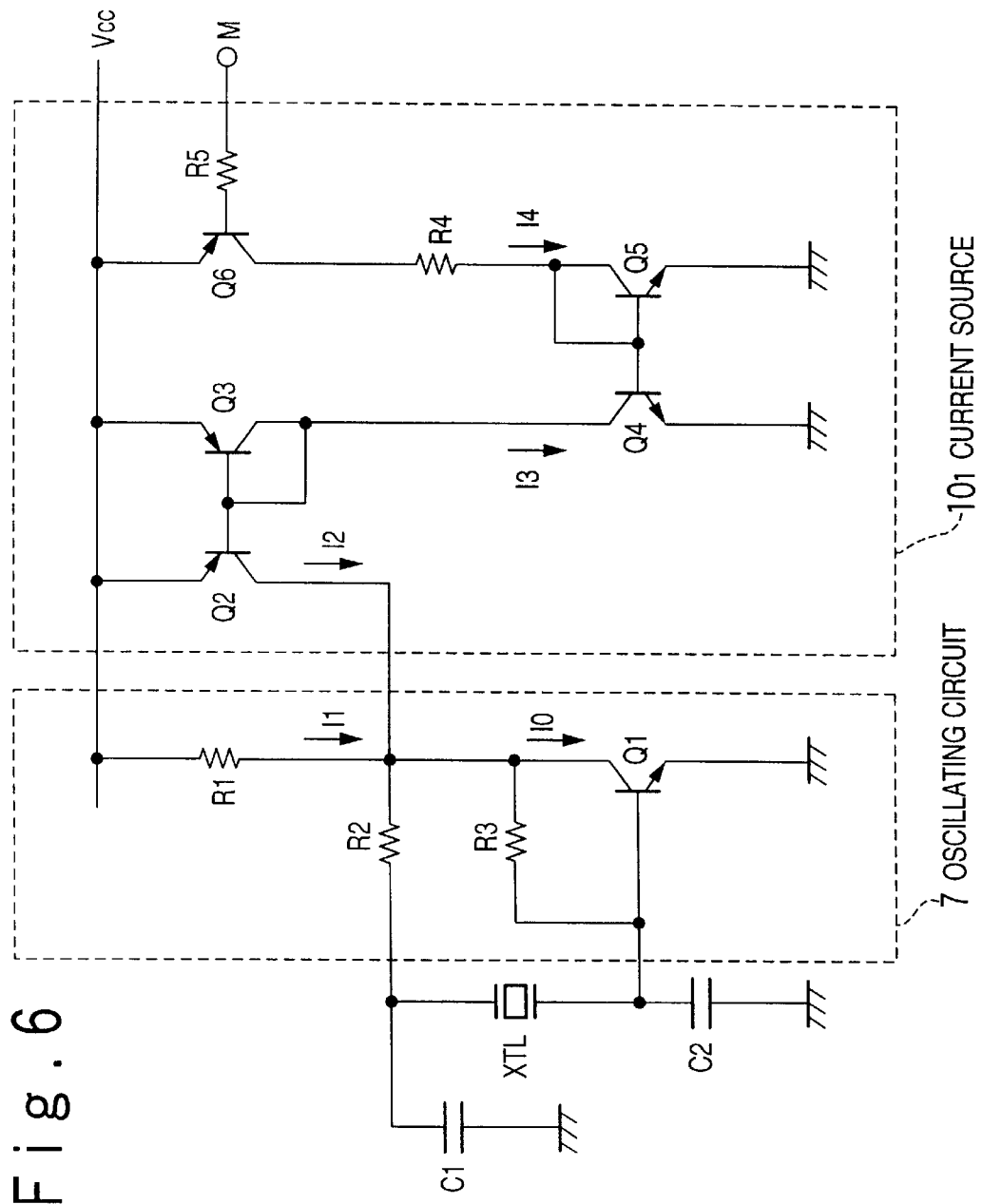
FIG. 6 is a detailed block diagram of a current source 101 and an oscillating circuit shown in FIG. 1.

FIG. 6 shows an example of a configuration of the current source 10 and the oscillating circuit 7. The oscillating circuit 7 is composed of a transistor Q1 and resistors R2 to R3.

Capacitors C1 and C2 and a quartz oscillation element XTL are connected to the oscillating circuit 7. The current source $10_1$ is composed of transistors Q2 to Q6 and resistors R4 and R5. The transistor Q6 turns ON and OFF the current source in accordance with a logic level of a terminal M. Current mirror circuits are constituted of the transistors Q2 to Q5 and the resistor R4 to determine a reference current I4.

The operations of the PLL oscillating circuit according to the first embodiment of the present invention will be described below.

Figure 8:
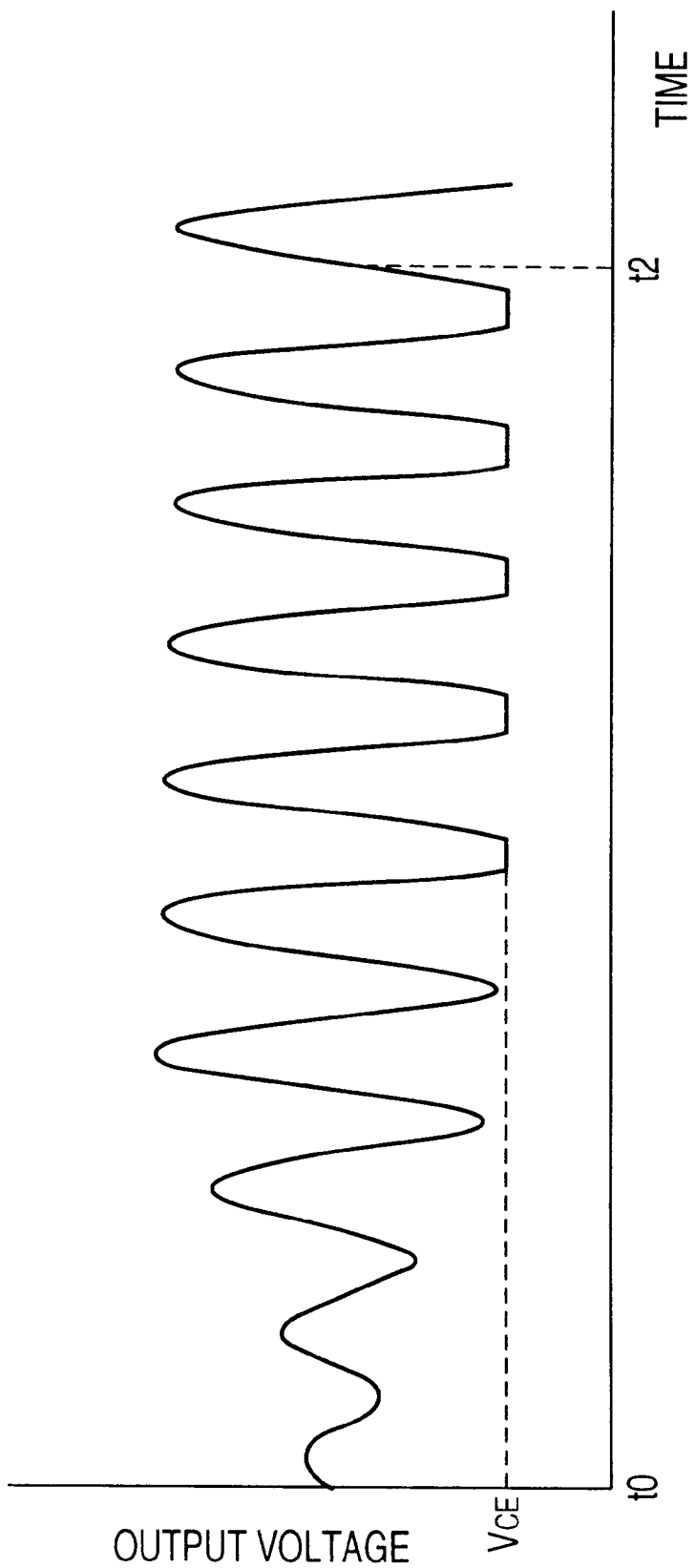
FIG. 8 is a waveform diagram illustrating a growth of an oscillation amplitude in the conventional PLL oscillating circuit.
Figure 10:
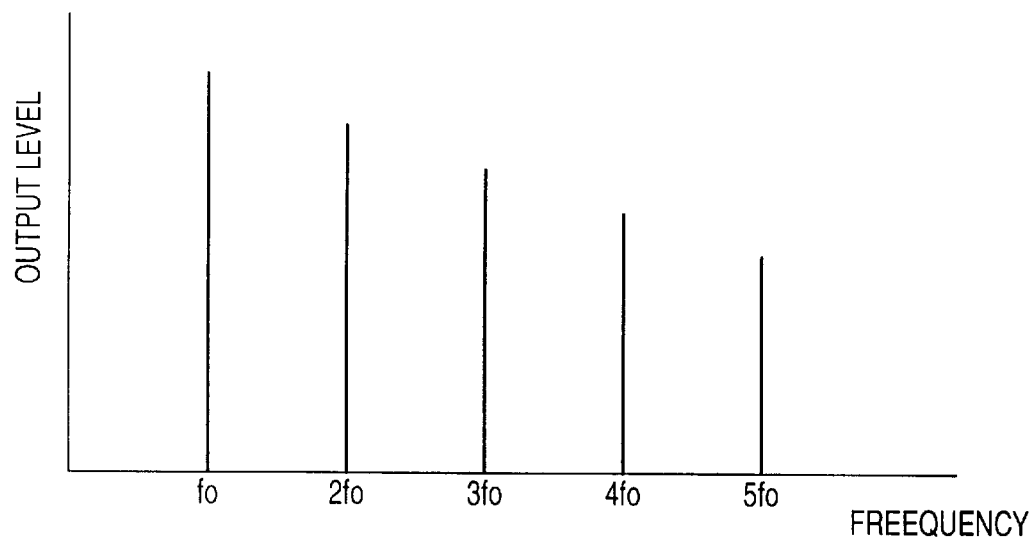
FIG. 10 is a diagram illustrating a frequency spectrum of the conventional PLL oscillation circuit.
Figure 11:
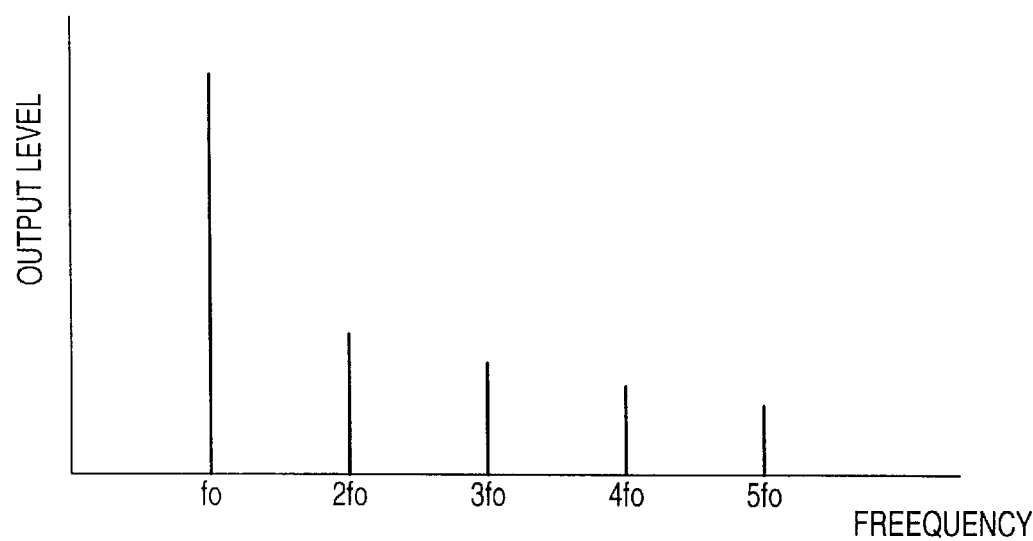
FIG. 11 is a diagram illustrating a frequency spectrum of an oscillation output of the PLL oscillating circuit according to the first embodiment of the present invention.

At first, the operation of a conventional oscillating circuit is described. FIG. 8 shows a growth process of an oscillation amplitude. The oscillating circuit functions as a class A operation when the oscillation is started, and the oscillation is a sine wave oscillation. In conjunction with the growth of the amplitude, the amplitude reaches a collector saturation region, and thereby the amplitude is limited. At this time, a transistor performs as a class C operation. Therefore, distortion of the wave form is brought about, so that a level of harmonic component noise becomes higher. As a result, the harmonic component noise has influence to other circuits, to cause the performance to be worse. FIG. 10 shows a frequency spectrum characteristic at a timing t2 shown in FIG. 8. The levels of the harmonic components having frequencies equal to two time, three times, and so on of the oscillation frequency f0 are higher. If a radio receiver is constituted of the PLL oscillating circuit using such a reference oscillating circuit, the harmonic component noise becomes spurious, so that the receiving sensitivity of the receiver is made extremely deteriorated.

As a countermeasure of reducing the harmonic component noise, it is effective to provide a low pass filter LPF after the oscillation output. After the passage through the LPF, a sine wave can be generated in which the harmonic components are removed and the distortion is little. However, the harmonic component noise is generated in the oscillation output. Thus, even the addition of the low pass filter LPF cannot prevent the radiation of the harmonic component noise to the other circuits.

Moreover, the oscillation of the sine wave can be kept by making the transconductance gm of the oscillating circuit smaller so that the amplitude level of the oscillation is not limited in the collector saturation region.

However, if the transconductance gm is made lower, the amplitude growth is delayed, so that the start performance is deteriorated. If the start performance is worse, the system performing the battery saving function must take a larger start margin. This causes a life of a battery in an apparatus to be shortened.

On the other hand, in the present invention, the transconductance gm indicating a gain of the oscillating circuit is switched between the start state and the steady state of the oscillating circuit, in order to reduce the harmonic component noise without dropping the start performance. The switching of the transconductance gm is performed by controlling the circuit current supplied to the oscillating circuit 7. When Ic is assumed to be a collector current of the transistor Q1 in the oscillating circuit 7, the transconductance gm is represented as follows:

$$gm = Ic/VT \qquad (1)$$

where $Vt \approx 26$ mV.

Figure 7:
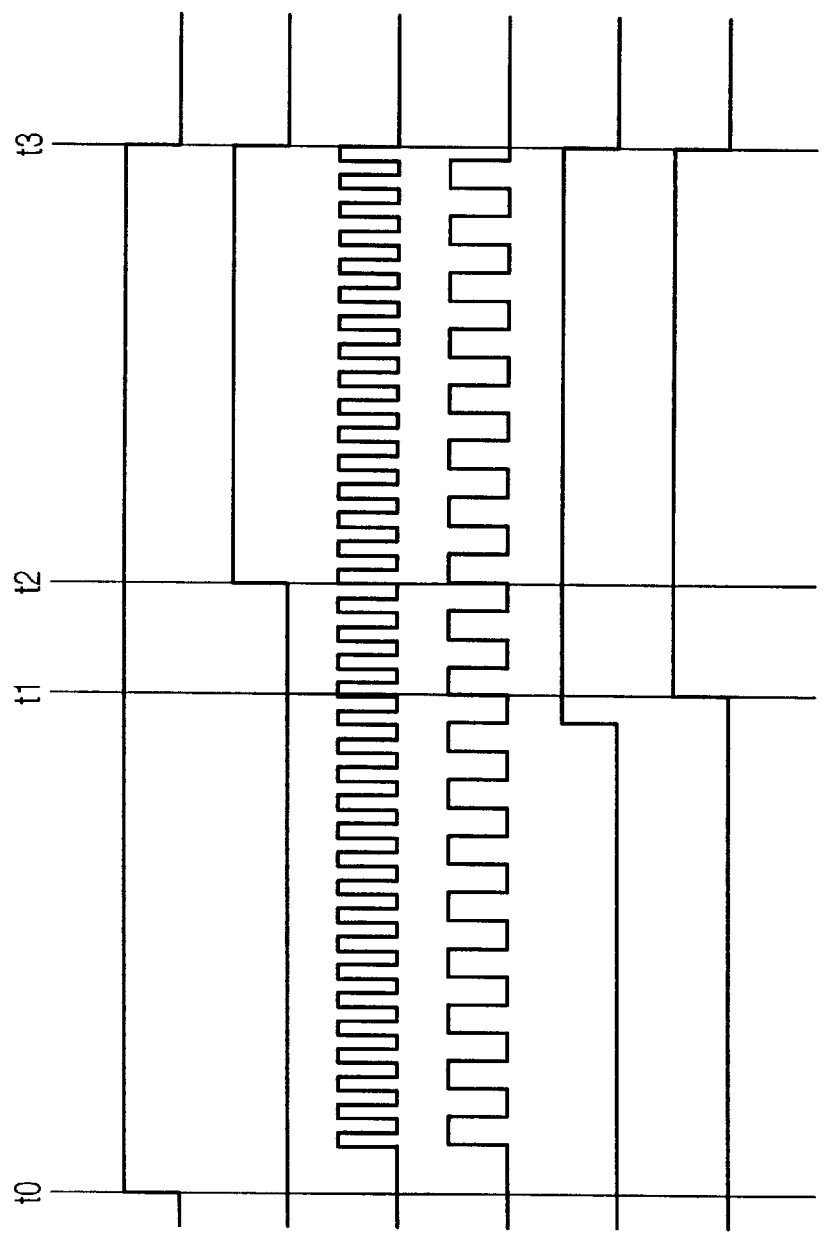
FIGS. 7A to 7F are timing charts of the PLL oscillating circuit according to the first embodiment of the present invention.

FIGS. 7A to 7F show timing charts at various points. A start control signal PS shown in FIG. 7A represents a signal for controlling an intermittent operation of the PLL oscillating circuit including the oscillating circuit 7. A signal RXON shown in FIG. 7B represents a signal for controlling an intermittent operation of the radio receiver. A signal OSC shown in FIG. 7C represents the reference oscillation signal as the output of the oscillating circuit 7. A signal TnQ shown in FIG. 7D represents a frequency division output signal supplied from the reference counter 4 to the D flip-flop 9. A signal D shown in FIG. 7E represents a lock detection signal as the output signal of the lock detector 8. A signal DEFQ shown in FIG. 7F represents the Q output signal from the D-FF 9.

Figure 9:
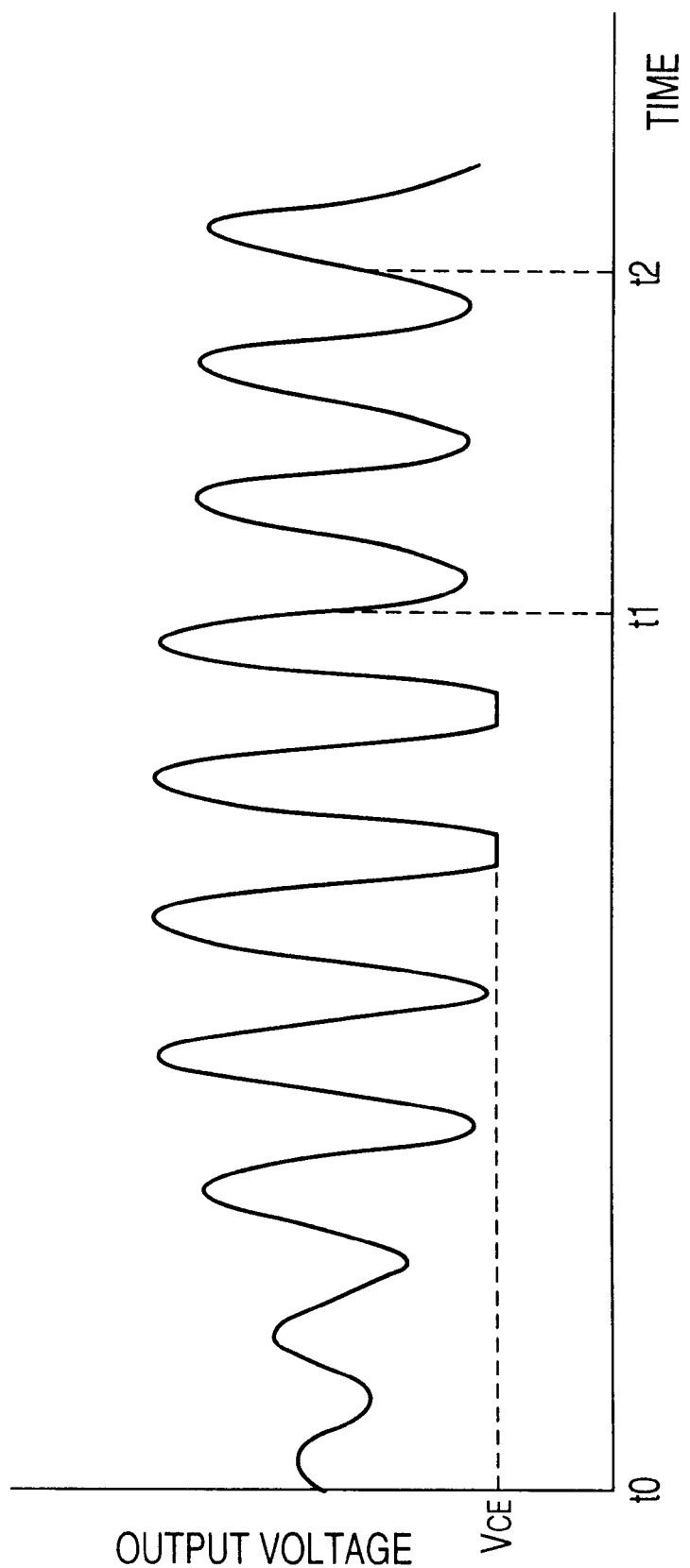
FIG. 9 is a waveform diagram illustrating a growth of an oscillation amplitude in the PLL oscillating circuit according to the first embodiment of the present invention.

When the signal PS rises up (t0) as shown in FIG. 7A, the oscillating circuit 7 is started. Then, the amplitude growth is started as shown in FIG. 9. Shortly, the oscillation is set to a steady oscillation state. When the lock detector 8 detects the lock of the PLL oscillating circuit to output the lock detection signal D (t1) as shown in FIG. 7E, the Q output DFFQ of the D flip-flop 9 is switched from a low level L to a high level H synchronous with the rising edge of the clock signal TnQ shown in FIG. 7D. The L and H signals of the DFFQ are used to control the current source 10 shown in FIG. 6.

At first, a case is described in which the Q output DEFQ of the L level is inputted to the terminal M. At this time, the transistor Q6 is in the active state. Thus, a current I4 flows through the resistor R4. Accordingly, the current I4 is represented by the following equation:

$$I4 = \{VCC - VCE(Q6) - VBE(Q5)\}/R4 \qquad (2)$$

The transistors Q4 and Q5 constitute the current mirror circuit. Hence, the following equation is obtained:

$$I4 \approx I3 \qquad (3)$$

Similarly, the transistors Q3 and Q2 also constitute the current mirror circuit, and thereby the following equation is obtained:

$$I3 \approx I2 \qquad (4)$$

The current I0 flowing through the transistor Q1 of the oscillating circuit 7 is a sum of a current I1 flowing through the resistor R1 as a load and the collector current I2 of the transistor Q2. Thus, the following equation is obtained:

$$I0 = I1 + I2 \qquad (5)$$

Next, a case is described in which the Q output DFFQ of the H level is inputted to the terminal M. At this time, the transistor Q6 is set to a cut off state. As a result, the I4 is:

$$I4 = 0 \qquad (6)$$

Thus, the I2 is:

$$I2 = 0 \qquad (7)$$

Accordingly, the I0 flowing through the transistor Q1 of the oscillating circuit 7 is:

$$I0 = I1 \qquad (8)$$

In this way, the collector current I0 of the transistor Q1 when the Q output DEFQ is set to the L state is larger by the current I2 than that of the transistor Q1 when the Q output DEFQ is set to the H state.

As mentioned above, when the Q output DEFQ is set in the L state, the current is represented as follows:

$$\text{Current} = H \rightarrow gm = H$$

When the Q output DEFQ is in the H state, the current is represented as follows:

Current=L→gm=L

Next, the switching operation of the Q output DEFQ will be described below. A time period from a time when the signal PS becomes in the H state to a time when the signal RXON becomes in the H state, i.e., (t2−t0) is referred to as the start margin. The oscillating circuit 7 must be started within the start margin to complete the lockup of the PLL oscillating circuit.

If the oscillating circuit 7 is quickly started, the PLL oscillating circuit can be quickly locked. For this purpose, the transconductance gm is set to be larger so that the amplitude of the oscillation output reaches a level necessary for the frequency dividing operation by the reference counter 4 as fast as possible.

If the current I0 flowing through the transistor Q1 of the oscillating circuit 7 is larger, the transconductance gm also becomes larger. Thus, the logic of the Q output DEFQ is set to be in the L state. On the other hand, the transconductance gm is set to be smaller so that the oscillation output is kept in a level at which it is not distorted by the collector saturation, in the time of the steady state. If the current I0 flowing through the transistor Q1 of the oscillating circuit 7 is smaller, the transconductance gm becomes smaller. For this purpose, the logic of the Q output DEFQ is set to be in the H state.

The oscillating circuit 7 is in the state of the class A operation, since having the small signal characteristic when the oscillation is started. The oscillating circuit is in the state of the class C operation until the completion of the lock state of the PLL oscillating circuit after the start of the oscillation. Then, the oscillating circuit 7 is in the state of the class A operation after the completion of the lock state of the PLL oscillating circuit.

The transconductance gm of the oscillating circuit 7 in the steady state has a condition that the oscillation can be continued. It is necessary to change the transconductance gm into the value in which the oscillating circuit performs the class A operation after the completion of the PLL oscillating circuit lock so as to generate the negative resistance −Rn necessary for the steady oscillation in the operation state of the small signal.

When an equivalent resistance of the quartz oscillator is assumed to be Re, the oscillation conditions at the times of the oscillation start and the steady oscillation are represented as follows:

in oscillation start; $Re < |-Rn|$ (9)

in steady oscillation; $Re = |-Rn|$ (10)

("Method of Analyzing and Designing Quartz Oscillation Circuit with AGC" (Electrical Society, ECT-94-49)written by Makoto Kanno, Kibun Cho and Yasuo Tsuzuki).

At the time of the oscillation start, the negative resistance |−Rn| of the oscillating circuit 7 is set to a sufficiently larger value, i.e., a value three to ten times larger than the equivalent resistance Re of the quartz oscillator. In the time of the steady oscillation, it is enough that the negative resistance |−Rn| of the oscillating circuit 7 is equal to the equivalent resistance Re of the quartz oscillator. The negative resistance |−Rn| of the oscillating circuit 7 is described in "Quartz Frequency Device" written by Shotaro Okano and published by (Techno).

The negative resistance −Rn at the time of the operation of the small signal is represented as follows:

$-Rn = -gm/\{\omega^2 C2(C1+C\pi)\}$ (11)

where C1 and C2 are load capacitances of the Colpitts oscillating circuit, and Cπ is a transistor capacitance. The negative resistance −Rn is proportional to gm, and the transconductance gm in the case of the steady oscillation is switched to a value equal to ⅓ to ⅒ a value at the time of the oscillation start, in order to satisfy the equation (10). Since the transconductance gm is proportional to the current I0 flowing through the transistor Q1 of the oscillating circuit, if the equation:

(circuit current at time of start)/(circuit current after lock completion)=3 to 10 (12)

is assumed, it is possible to give the transconductance gm for the oscillating circuit 7 to perform the class A operation after the completion of the PLL oscillating circuit lock.

As mentioned above, the present invention can digitally change the transconductance gm at the time t1 after the completion of the PLL oscillating circuit lock within the time period of the start margin from the time t0 to the time t2.

The transistor Q1 of the oscillating circuit 7 starts the class A operation at the time t0, and then shits from the class A operation to the class C operation in the time period from the time t0 to the time t1, and again returns from the class C operation to the class A operation in the time period from the time t1 to the time t2. Thus, it is possible to suppress the radiation of the harmonic component noise and to reduce the power consumption in the steady state without dropping the start performance.

The PLL oscillating circuit according to the second embodiment of the present invention will be described below with reference to FIG. 12.

The oscillating circuit 7 is composed of resistors R11 to R13 and transistors Q11 and Q12. The current source 10₂ is composed of resistors R14 and R15 and transistors Q13 to Q16. The transistor Q16 functions as a switch in accordance with a logic of a terminal M. The transistors Q13 to Q15 constitutes a current mirror circuit. Also, the transistors Q12 and Q14 constitutes another current mirror circuit. This has a constitution that the transconductance gm is switched by reducing a current I5 flowing through the transistor Q11 of the oscillating circuit 7.

When the terminal M of the current source 10₂ is in the low level L, the transistor Q16 is in a cut off state. Therefore, a current I8 of the current mirror does not flow. As a result, a current does not flow through the transistor Q12. Thus, a current I5 flowing through the transistor Q11 is:

I5=I6 (13)

On the other hand, when the terminal M is in the high level H, the transistor Q16 is set to the active state. Thus, the current I8 flows through the current mirror circuit. As a result, the transistor Q12 is turned ON, such that a collector current I7 flows. The current I5 flowing through the transistor Q11 is subtracted by the current I7 flowing through the transistor Q12, and represented as follows:

I5=I6−I7 (14)

In this way, similarly to the current source 10₁ in FIG. 6, when the Q output DEFQ of the D flip-flop 9 is in the low level L, the current is represented as follows:

Current=H→gm=H

When the Q output DEFQ is in the high level H, the current is represented as follows:

Current=L→gm=L

Next, the PLL oscillating circuit according to the third embodiment of the present invention will be described below with reference to FIG. 13.

In a configuration shown in FIG. 13, the oscillating circuit 7 is composed of resistors R22 and R23 and transistors Q21 to Q23. The current source $10_3$ is composed of resistors R24 to R27 and transistors Q24 to Q27. The transistors Q22 and Q24, and Q23 and Q26 constitute current mirror circuits. Thus, the load of an oscillating circuit 7 is an active load. The current flowing through the oscillating circuit 7 and the transconductance gm are switched by selecting a transistor to be turned ON.

The transistors Q25 and Q27 of the current source $10_3$ are switches which are turned ON and OFF in accordance with logics of terminals M and M', respectively. The Q and Q (bar) outputs of the D flip-flop 9 are used for the terminals M and M', respectively. The logics of the terminals M and M' are complementary to each other. Thus, either one of the transistors Q25 and Q27 is turned ON, and either one of active load transistors Q22 and Q23 of the oscillating circuit 7 is turned ON by the current mirror.

It is supposed that the terminal M is in the low level L, the terminal M' is in the high level H. At this time, the transistor Q27 is turned ON. Accordingly, a current I11 of the current mirror flows, and also a current I11 flows through the transistor Q23. The collector current I9 flowing through the transistor Q21 is:

$$I9 = I11 \quad (15)$$

On the other hand, it is supposed that the terminal M is in the high level H, the terminal M' is in the low level L. At this time, the transistor Q25 is turned ON. Accordingly, a reference current I10 of the current mirror flows, and also an current I10 flows through the transistor Q22. Therefore, the collector current I9 flowing through the transistor Q21 is:

$$I9 = I10 \quad (16)$$

Figure 12:
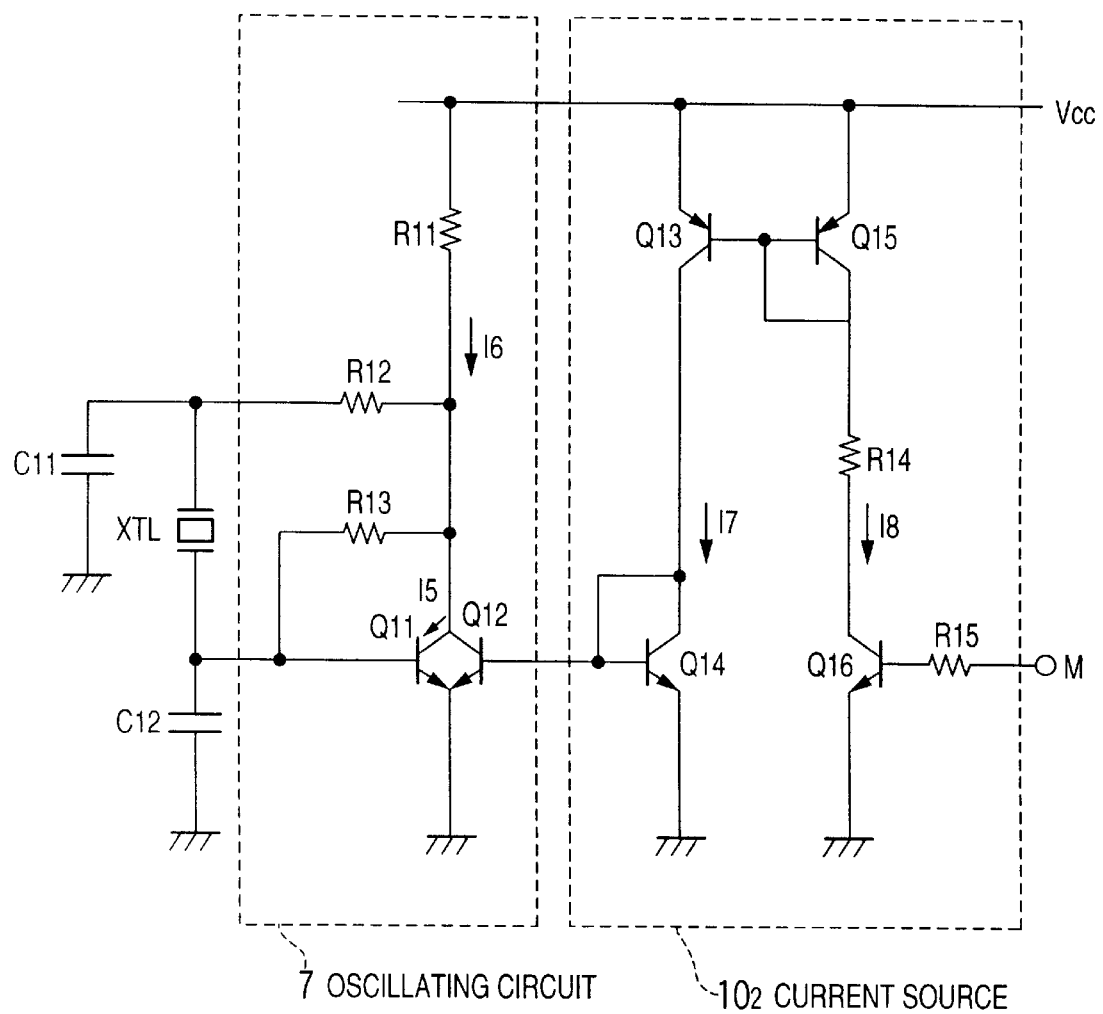
FIG. 12 is a block diagram illustrating the oscillating circuit and the current source in the PLL oscillating circuit according to a second embodiment of the present invention.

If a relation that the resistor R24 is larger than the resistor R25 is set, the transconductance gm can be switched in accordance with the logic similar to that applied to the current source $10_1$ in the first embodiment shown in FIG. 6 and that applied to the current source $10_2$ in the second embodiment shown in FIG. 12.

Figure 1:
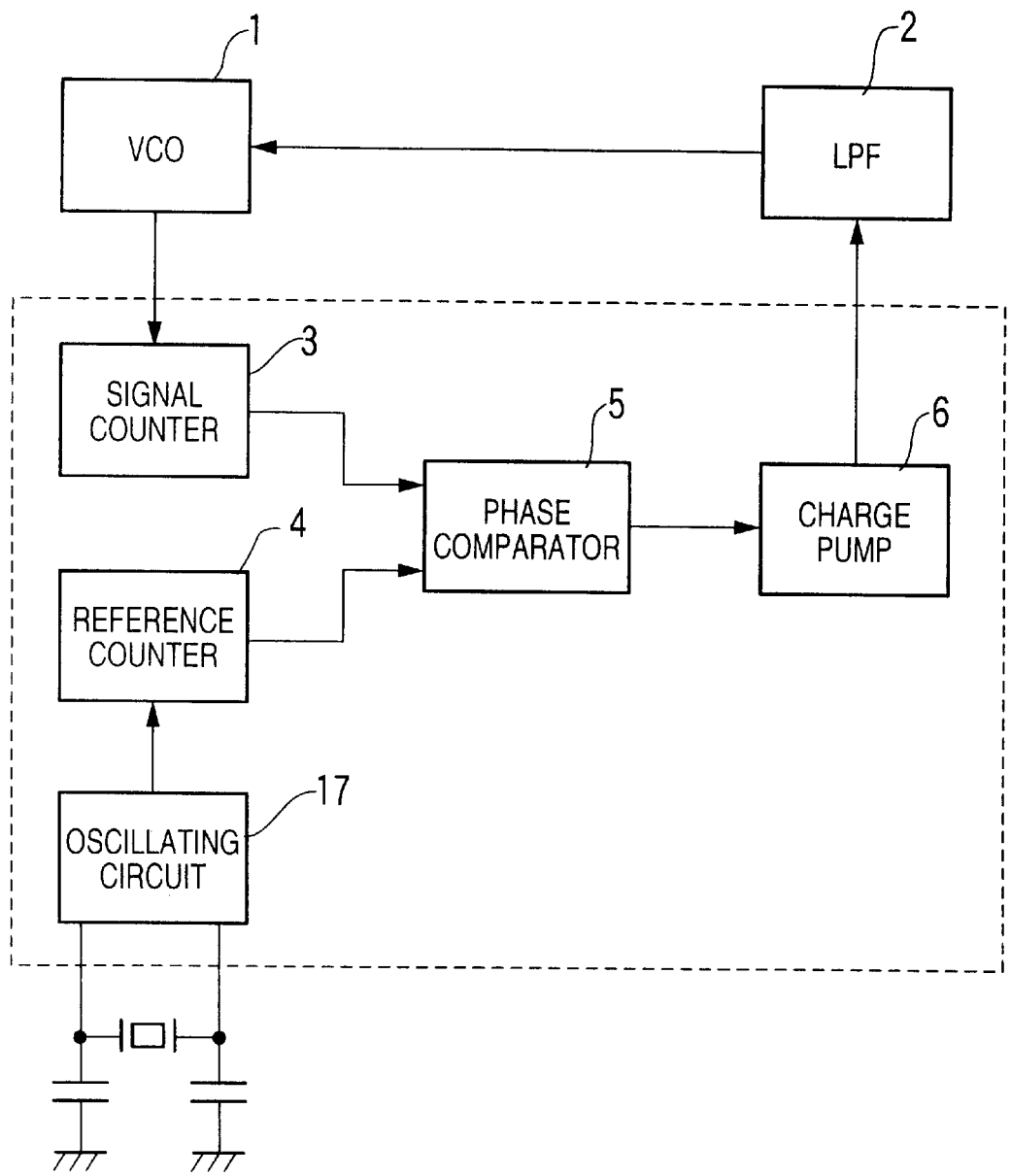
FIG. 1 is a block diagram illustrating an example of a conventional PLL oscillating circuit.
Figure 2:
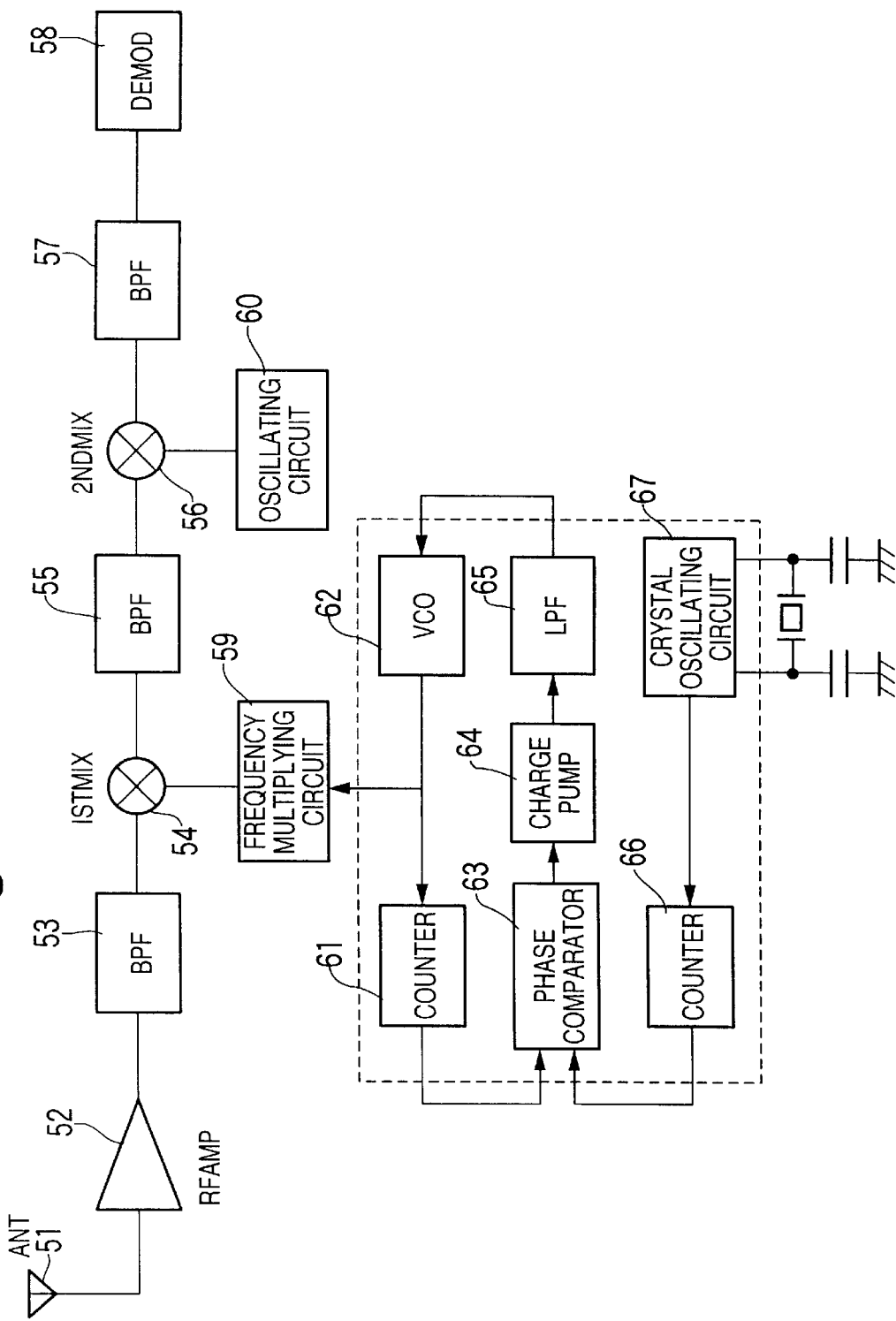
FIG. 2 is a block diagram illustrating a selective call radio receiver using the conventional PLL oscillating circuit.

The PLL oscillating circuit can be applied to a radio apparatus as shown in FIG. 2. In this case, the PLL oscillating circuit of the present invention is used in place of the conventional PLL circuit.

As mentioned above, according to the present invention, the current of the oscillating circuit is controlled and switched to change the transconductance gm between the time of the start and the time of the steady state after the completion of the PLL oscillating circuit lock. Thus, the harmonic component noise in the steady time can be reduced without dropping the oscillation start performance at the time of the start.

Also, according to the present invention, the power consumption can be reduced since the circuit current in the time of the steady state is smaller than that in the time of the start.

What is claimed is:

1. A phase locked loop (PLL) oscillating circuit comprising:

a first oscillating circuit which generates an oscillation signal with a first frequency, and controls said first frequency based on a reference signal;

a lock detector for detecting phase lock between said oscillation signal and said reference signal to provide a lock detection signal; and a reference oscillating circuit which includes, a crystal oscillation element, an oscillating circuit, coupled to the crystal oscillation element, for oscillating to generate a first signal, a frequency divider for dividing said first signal in frequency to generate said reference signal, and a control circuit for controlling said oscillating circuit in response to a start signal to oscillate with a first transconductance and for controlling said oscillating circuit in response to said lock detection signal to oscillate with a second transconductance which is smaller than said first transconductance, such that an oscillation state of said reference oscillating circuit is controlled based on said lock detection signal.

2. A PLL oscillating circuit according to claim 1, wherein when said oscillating circuit oscillates with said first transconductance, an absolute value of a negative resistance of said oscillating circuit is three time to ten times more than an equivalent resistance of said crystal oscillation element, and wherein when said oscillating circuit oscillates with said second transconductance, the absolute value of the negative resistance of said oscillating circuit is equal to the equivalent resistance of said crystal oscillation element.

3. A PLL oscillating circuit according to claim 1, wherein said oscillating circuit includes:

said crystal oscillation element;

an oscillation transistor for performing an oscillation operation using said crystal oscillation element; and a control transistor provided in parallel to said oscillation transistor, and being activated in response to a control signal, and wherein said control circuit outputs said control signal to said control transistor in response to said lock detection signal to reduce a collector current of said oscillation transistor such that said oscillation transistor continues the oscillation operation with the reduced collector current.

4. A PLL oscillating circuit according to claim 1, wherein said oscillating circuit includes:

said crystal oscillation element;

an oscillation transistor for performing an oscillation operation using said crystal oscillation element;

a first control transistor activated in response to a first control signal; and a second control transistor activated in response to a second control signal, and wherein said control circuit outputs said first control signal to said first control transistor in response to said start signal such that said first control transistor flows a first current as a collector current of said oscillation transistor, and outputs said second control signal to said second control transistor in response to said lock detection signal such that said second control transistor flows a second current as the collector current of said oscillation transistor, said second current is smaller than said first current, and said oscillation transistor continuing the oscillation operation with the second current.

5. A PLL oscillating circuit according to claim 1, wherein said oscillating circuit includes:

said crystal oscillation element; and an oscillation transistor for performing an oscillation operation using said crystal oscillation element, and wherein said control circuit controls said oscillation transistor to perform a class A operation and then a class C operation in response to said start signal and controls said oscillation transistor to perform said class A operation in response to said lock detection signal.

6. A method of controlling oscillation in an oscillation circuit using a crystal oscillation element, comprising:

starting oscillation in response to a first signal to oscillate with a first transconductance;

increasing an amplitude of said oscillation; and decreasing said amplitude of said oscillation to oscillate with a second transconductance which is smaller than the first transconductance to oscillate with a smaller oscillation current than with the first transconductance to reduce generated noise and power consumption, in response to a second signal which indicates that the oscillation of the oscillation circuit has achieved a steady state oscillation, after said first signal.

7. A method according to claim 6, wherein a transconductance of said oscillation circuit in said starting step and said increasing step is larger than that of said oscillation circuit in said decreasing step.

8. A method according to claim 6, wherein said oscillation circuit includes an oscillation transistor for performing said oscillation using said crystal oscillation element, and wherein said starting step and said increasing step include supplying a first collector current to said oscillation transistor, and said decreasing step includes supplying a second collector current to said oscillation transistor, said second collector current being smaller than said first collector current.

9. A method according to claim 6, wherein said oscillation circuit includes an oscillation transistor for performing said oscillation using said crystal oscillation element, and wherein said oscillation transistor operates in a class A in said starting step, in a class C in said increasing step, and in said class A in said decreasing step.

10. An oscillating circuit comprising:

an oscillating section, including a crystal oscillation element, oscillating to generate a first oscillation signal;

a control section for controlling said oscillating section in response to a first timing signal to oscillate with a first transconductance and for controlling said oscillating section in response to a second timing signal to oscillate with a second transconductance which is smaller than said first transconductance to oscillate with a smaller oscillation current than with the first transconductance to reduce generated noise and power consumption, said second timing signal being generated after the oscillation of the oscillating circuit has achieved a steady state oscillation, after said first timing signal.

11. An oscillating circuit according to claim 10, wherein when said oscillating section oscillates with said first transconductance, an absolute value of a negative resistance of said oscillating section is three time to ten times more than an equivalent resistance of said crystal oscillation element, and wherein when said oscillating section oscillates with said second transconductance, the absolute value of the negative resistance of said oscillating section is equal to the equivalent resistance of said crystal oscillation element.

12. An oscillating circuit according to claim 10, wherein said oscillating section includes:

an oscillation transistor for performing an oscillation operation using said crystal oscillation element; and a control transistor provided in parallel to said oscillation transistor, and being activated in response to a control signal, and wherein said control section outputs said control signal to said control transistor in response to said second timing signal to reduce a collector current of said oscillation transistor such that said oscillation transistor continues the oscillation operation with the reduced collector current.

13. An oscillating circuit according to claim 10, wherein said oscillating section includes an oscillation transistor for performing an oscillation operation using said crystal oscillation element;

a first control transistor activated in response to a first control signal; and a second control transistor activated in response to a second control signal, and wherein said control section outputs said first control signal to said first control transistor in response to said first timing signal such that said first control transistor flows a first current as a collector current of said oscillation transistor, and outputs said second control signal to said second control transistor in response to said second timing signal such that said second control transistor flows a second current as the collector current of said oscillation transistor, said second current is smaller than said first current, and said oscillation transistor continuing the oscillation operation with the second current.

14. An oscillating circuit according to claim 10, wherein said oscillating section includes:

an oscillation transistor for performing an oscillation operation using said crystal oscillation element, and wherein said control section controls said oscillation transistor to perform a class A operation and then a class C operation in response to said start signal and controls said oscillation transistor to perform said class A operation in response to said lock detection signal.

15. An oscillating circuit according to claim 10, wherein said oscillating section is used in a phase locked loop (PLL) oscillating circuit, and wherein said first timing signal is a start signal and said second timing signal is a lock detecting signal indicative of a lock state of said PLL circuit.

16. An oscillating circuit according to claim 15, wherein said PLL oscillating circuit is used in a radio apparatus.

* * * * *